(12) United States Patent
Iranmanesh

(10) Patent No.: US 6,177,709 B1
(45) Date of Patent: Jan. 23, 2001

(54) CELL BASED ARRAY HAVING COMPUTE/ DRIVE RATIOS OF N:1

(75) Inventor: Ali A. Iranmanesh, Sunnyvale, CA (US)

(73) Assignee: Synopsys, Inc., Mountain View, CA (US)

(*) Notice: Under 35 U.S.C. 154(b), the term of this patent shall be extended for 0 days.

(21) Appl. No.: 08/885,148

(22) Filed: Jun. 30, 1997

(51) Int. Cl.[7] .................... H01L 27/11; H01L 27/118
(52) U.S. Cl. .................... 257/390; 257/206; 257/207; 257/208; 257/211
(58) Field of Search .................... 257/390, 206, 257/208, 209, 210

(56) References Cited

U.S. PATENT DOCUMENTS

| 5,055,716 | * | 10/1991 | El Gamel | 307/446 |
|---|---|---|---|---|
| 5,079,182 | * | 1/1992 | Ilderem et al. | 437/57 |
| 5,289,021 | | 2/1994 | El Gamal | 257/206 |
| 5,325,336 | | 6/1994 | Tomishima et al. | 365/207 |
| 5,444,276 | | 8/1995 | Yokota et al. | 257/207 |
| 5,742,078 | | 4/1998 | Lee et al. | 257/202 |
| 5,777,369 | | 7/1998 | Lin et al. | 257/368 |
| 5,874,754 | * | 2/1999 | Lee et al. | 257/206 |

* cited by examiner

Primary Examiner—Leo P. Picard
Assistant Examiner—Hung Van Duong
(74) Attorney, Agent, or Firm—James E. Eakin; McDermott, Will & Emery

(57) ABSTRACT

Method and apparatus are disclosed for a low power, high density cell based array structure that permits implementation of designs having compute/drive cell ratios of N:1. The improved performance is provided in part by relocating the substrate and well taps within the compute cell, and in at least some instances by removing the well tap from the drive cell. Further, an extra routing track may be provided by not sharing source/drain areas of adjacent drive cells.

5 Claims, 6 Drawing Sheets

CELL BASED ARRAY HAVING COMPUTE/DRIVE RATIOS OF N:1

FIELD OF THE INVENTION

This application relates to designs for cell based arrays, and particularly relates to low power, high density designs for cell based arrays.

BACKGROUND OF THE INVENTION

The use of gate arrays and standard cells has become well known as an effective and efficient method for rapidly developing new semiconductor products substantial complexity. Such standard cells are typically used in cell-based arrays, and have wide application within the industry. A widely-accepted design for a gate array architecture that provides standard cell type densities is based on the design described in U.S. Pat. No. 5,289,021, commonly assigned to the assignee of the present invention and incorporated herein by reference.

However, despite the many advantages offered by cell based arrays, prior art designs cells have suffered from some limitations which have become more apparent as line widths have been reduced and complexity has increased. In particular, the typical prior art standard cell has been limited to a relatively low ratio between compute and drive cells. In particular, prior art designs have limited the ratio between compute and drive cells to no more than three- or four-to-one. Moreover, manufacturing limitations have served to impose a fixed, three-to-one limitation on most if not all prior art designs. Although the three-to-one ratio has enabled efficient construction of a great many circuits, and is particularly well suited to many high performance designs, there remain other applications—for example, low power applications—which could benefit from a ratio of compute to drive cells other than (and typically greater than) three-to-one.

As a result, there has been a need to develop a cell based array design which permits the implementation of larger, and in some instances unlimited, ratios of compute to drive cells.

SUMMARY OF THE INVENTION

The present invention substantially overcomes the limitations of the prior art by providing an extremely compact cell based array which permits high density, low power designs, including permitting designs implementing a virtually unlimited range of ratios between compute and drive cells. In particular, the present invention involves providing design flexibility to permit the ratio of compute cells to drive cells to be design dependent, and therefor optimized for each particular design. Because of the substantially larger size of the drive cell transistors compared to the compute cell transistors, increasing ratios of compute to drive cells offers significant reduction in power consumption, among other benefits. Further, higher densities can result for designs with high C/D ratios.

The cell based array of the present invention involves a new and novel cell structure which involves rearrangement of the compute cells relative to each other and to any associated drive cells, with the objectives of providing, among other things, lower power, higher density operation with greater optimization. To achieve these goals, an exemplary embodiment of the present invention includes adding a substrate tap to the compute cell and arranging adjacent compute cells to permit the substrate tap to be shared between adjacent compute cells. Further, although optional, the n-well taps preferably abut between adjacent compute cells.

In contrast to the compute cells, however, in at least some embodiments the well and substrate taps are preferably removed from the drive cell. Still further, in at least a presently preferred embodiment the source/drain areas of the transistors for adjacent drive cells is separated, thereby improving routability by providing an extra routing track between the drive cells.

Still further, additional performance gains may be provided by, in at least some embodiments, adding additional polysilicon heads to the drive cell while at the same time minimizing the number of bent gates to effectively increase channel width of the drive cell's PMOS device.

The invention is particularly well-suited to complex integrated circuits such cell-based arrays, but may be successfully implemented in a wide variety of circuit designs. Although the invention is explained in the context of a cell-based ray, it is to be understood that such an embodiment is exemplary only and not limiting.

The foregoing and other advantages of the present invention may be better appreciated from the following Detailed Description of the Invention, taken together with the attached Figures.

THE FIGURES

DETAILED DESCRIPTION OF THE INVENTION

Figure 1:
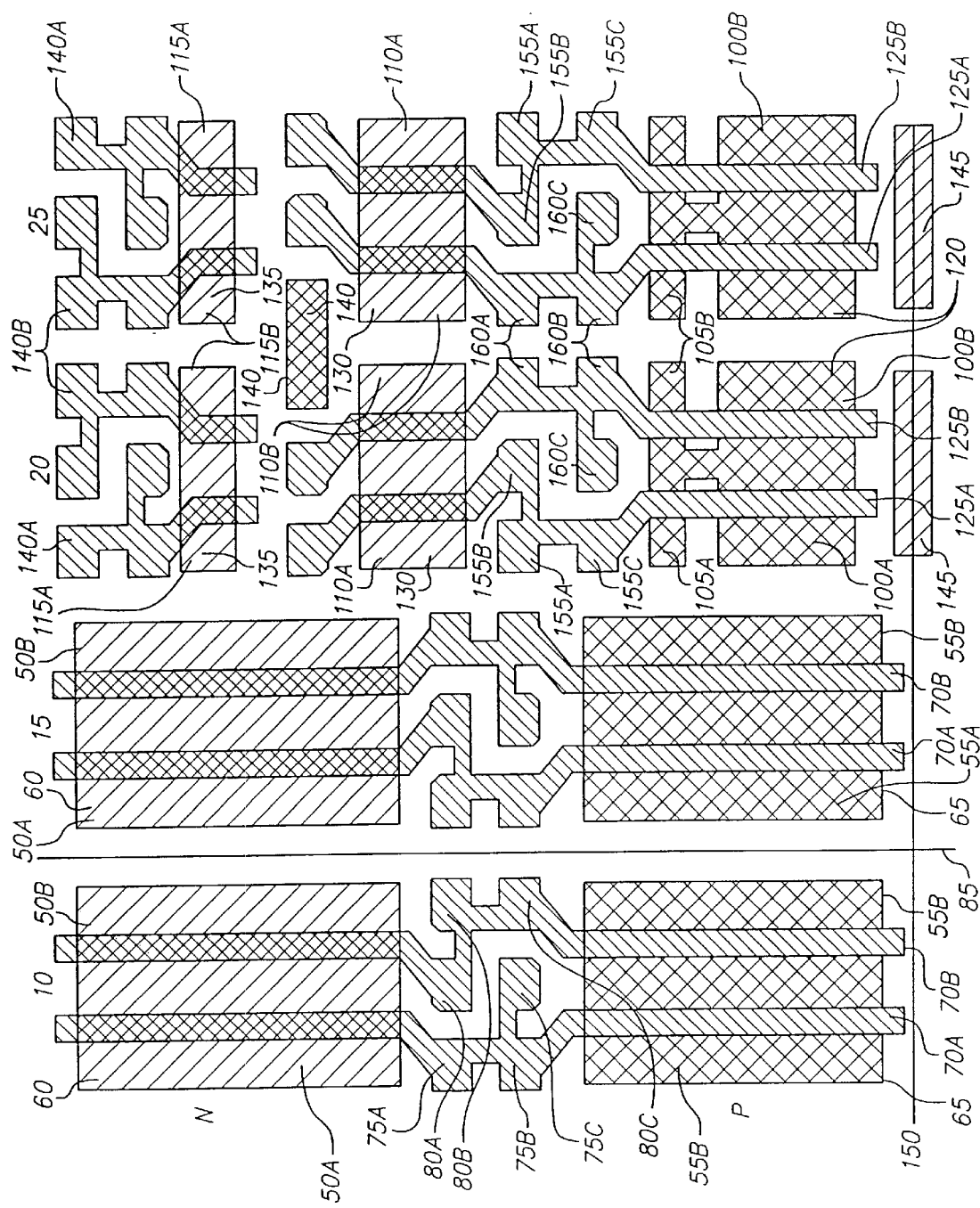
FIG. 1 shows an exemplary cell implementation using a presently referred structure of the present invention.
Figure 2:
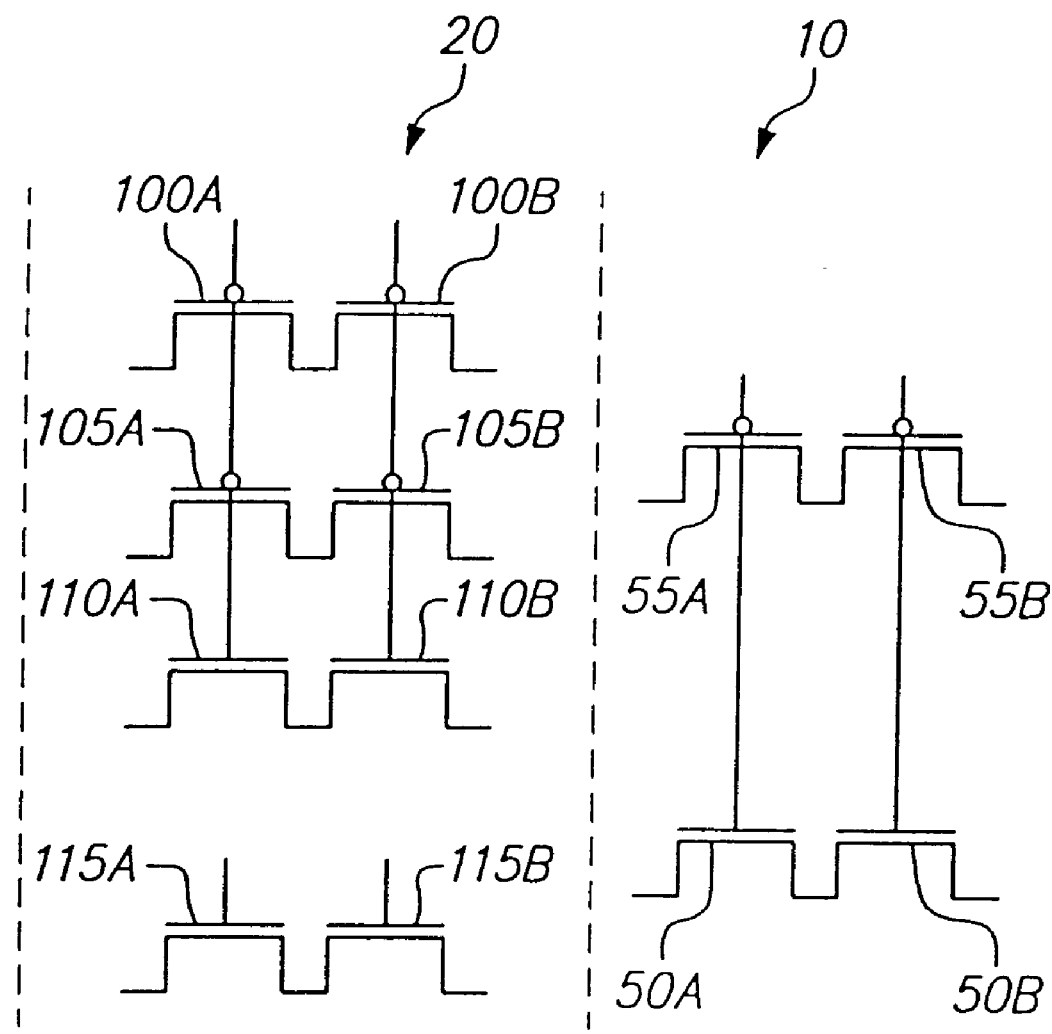
FIG. 2 shows the circuit diagram for the drive and compute portions of FIG. 1.

Referring first to FIGS. 1 and 2, first and second drive cells 10 and 15, respectively are juxtaposed with first and second compute cells 20 and 25. Each of the drive cells 10 and 15 can be seen to comprise transistors significantly larger than the compute cells 20 and 25. As will be appreciated hereinafter, the compute cells 20 and 25 are typically associated with the drive cell 15, while the drive cell 10 is associated with other compute cells to its left and not shown in FIG. 1. In addition, in the exemplary embodiment of FIG. 1, the compute cells 20 and 25 can be seen to be mirror images of one another. Such mirror image arrangement can be of helpful but is not required. In contrast, the drive cells 10 and 15 are not mirror images of one another.

Still with reference to FIGS. 1 and 2, each drive cell comprises a pair of N-type transistors 50A–B and a second pair of P-type transistors 55A–B. The layout of the transistors, best seen in FIG. 1, includes an N-well portion 60 and a P-well portion 65. Polysilicon gates 70A–B connect the N and P wells or diffusions to form the transistors as shown in FIG. 2. One additional aspect of the drive cells of FIG. 1 is that neither drive cell includes either an N-well tap or a substrate tap.

In addition, each of the gates 70A–B includes multiple polysilicon heads 75A–C and 80A–C, respectively. Importantly, in the exemplary embodiment of FIG. 1, the source and drain areas between adjacent drive sections is not shared. This permits an extra routing track 85 to be placed between the drive cells 10 and 15, thus improving routability of designs developed from the standard cell of FIG. 1. In addition, the mulitple polysilicon heads 75A–C and 80A–C permit easier connectivity by reducing wiring congestion and routing utilization. Further, the removal of the substrate taps and well taps from the drive sections permits easier layout and improves yield.

With reference to the compute portion of FIGS. 1 and 2, the transistors in the compute cells 20 and 25 can be better appreciated. As with the drive cell portion, the compute cell transistors are arranged in pairs. The transistor pairs shown in layout form in FIG. 1 are shown in FIG. 2 in schematic form, and comprise P-type pairs 100A–B and 105A–B, as well as N-type pairs 110A–B and 115A–B. With particular reference to FIG. 1, the layout of transistor pairs 100A–B, best seen in FIG. 1, can be seen to comprise P-diffusion 120 together with polysilicon gates 125A–B. In addition, a pair of N-type diffusions 130 and 135 in each compute cell, together with extensions to gates 125A–B as well as additional polysilicon gates 140A–B, permits construction of transistor pairs 110A–B and 115A–B. It will be appreciated that the P-type transistor pair 100A–B is larger than P-type transistor pair 105A–B. Likewise, N-type transistor pair 110A–B is larger than N-type transistor pair 115A–B. There can thus be seen to be four sizes of transistors (two different PMOS sizes and two different NMOS sizes) in a single compute cell 20. However, the particular sizes of the respective transistors can be optimized according to a variety of criteria, and thus the relative transistor sizes shown herein is merely exemplary and not limiting.

In addition, each compute cell includes a substrate tap 140 which, at least in the exemplary embodiment of FIG. 1 though not necessarily, abuts the substrate tap 140 of the adjacent compute cell. Likewise, an N-well tap 145 is constructed for each compute cell. The N-well taps 145 are typically tied together electrically by conductive run 150. Like the drive cells, the polysilicon gates include multiple polysilicon heads 155A–C and 160A–C.

Figure 3:
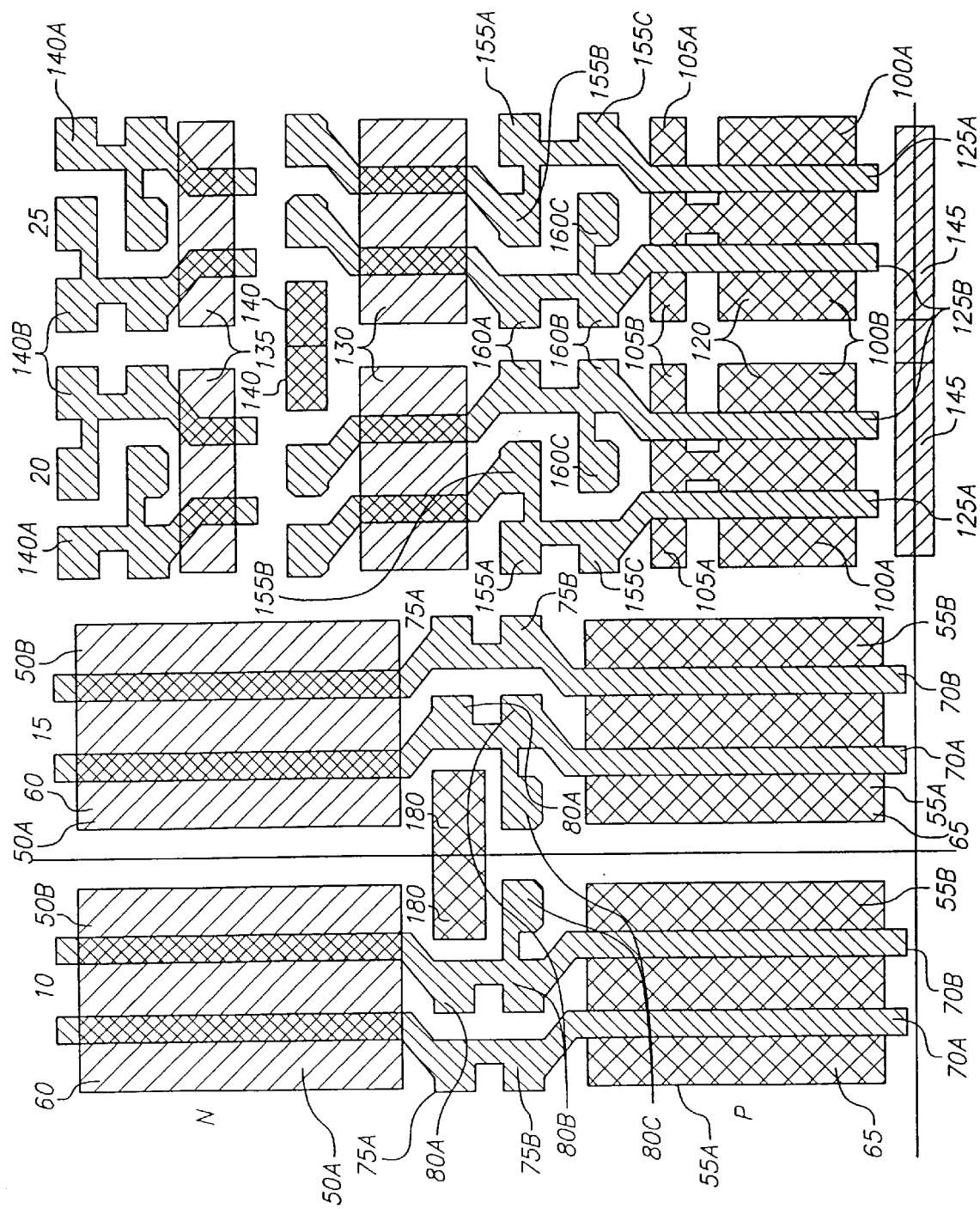
FIG. 3 shows an exemplary cell implementation using an alternative structure of the present invention.

Referring next to FIG. 3, an alternative to the cell layout of FIG. 1 is shown. For simplicity, and in view of the substantial similarity between FIGS. 1 and 3, like elements have been given like serial numbers. In particular, FIG. 3 shows a substrate tap 180 in each drive cell, with the drive cells 180 of adjacent cells abutting one another. In addition, the well taps 145 in adjacent compute cells are shown abutting one another in FIG. 3, whereas they are not abutting in FIG. 1. To accommodate the substrate taps 180, one poly head 75 has been eliminated from polysilicon gate 70A.

Figure 4:
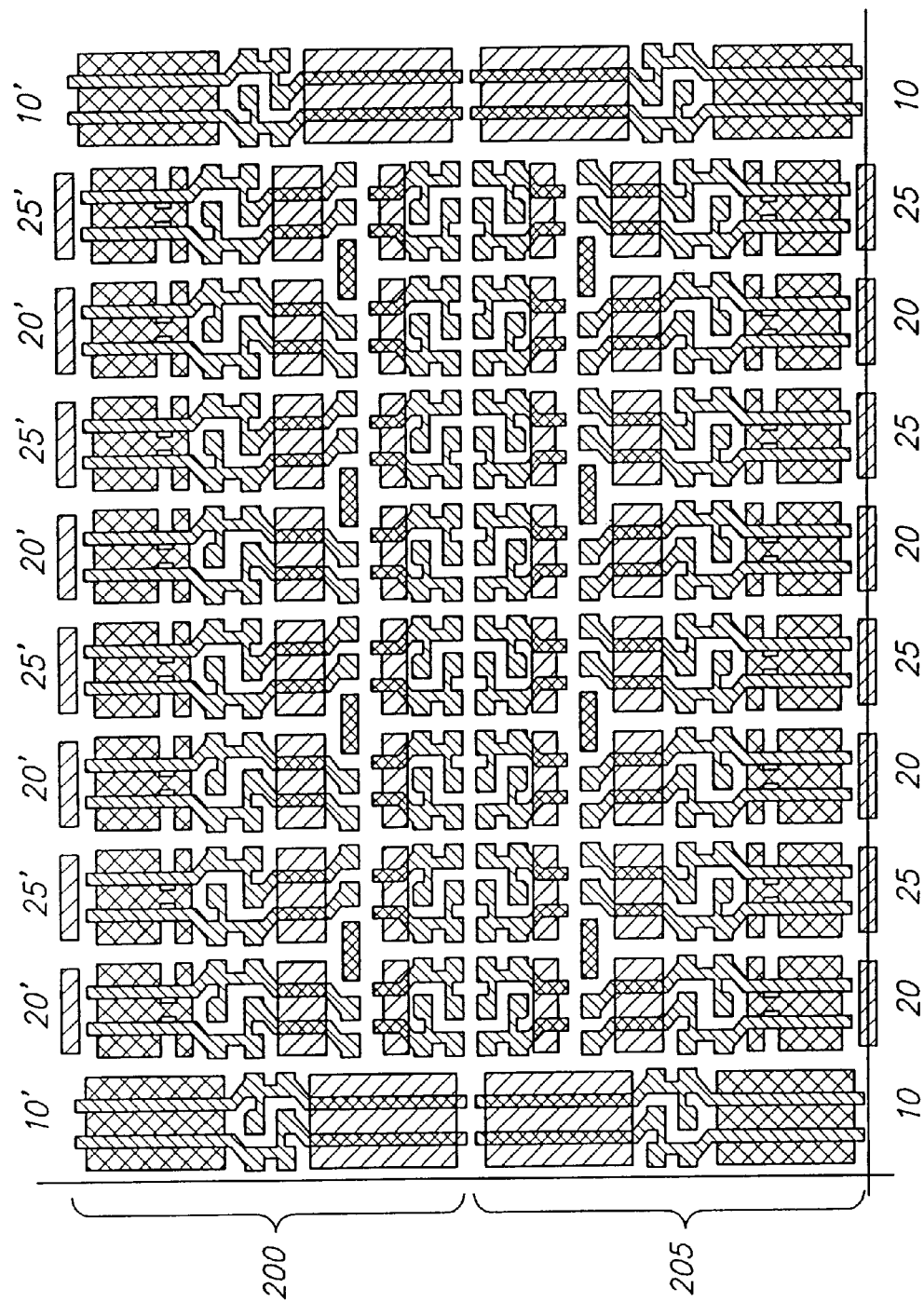
FIG. 4 shows a portion of an array constructed in accordance with the present invention, including the implementation of a 4:1 ratio between compute and drive cells within a device.

Referring next to FIG. 4, a portion of a cell array is shown. In particular, the portion of the array shown in FIG. 4 can be seen to comprise an upper row 200 and a lower row 205, with the upper row 200 the mirror image of the lower row 205. In each row, a plurality of four compute cells 20 (or 20') are shown arrayed alternately with four compute cells 25 (or 25'). Outboard of the compute cells, at either end, is a drive cell 10 or 10'. In a typical arrangement half of the compute cells in each row are associated with the closest drive cell in that row, or a ratio of 4:1.

Figure 5:
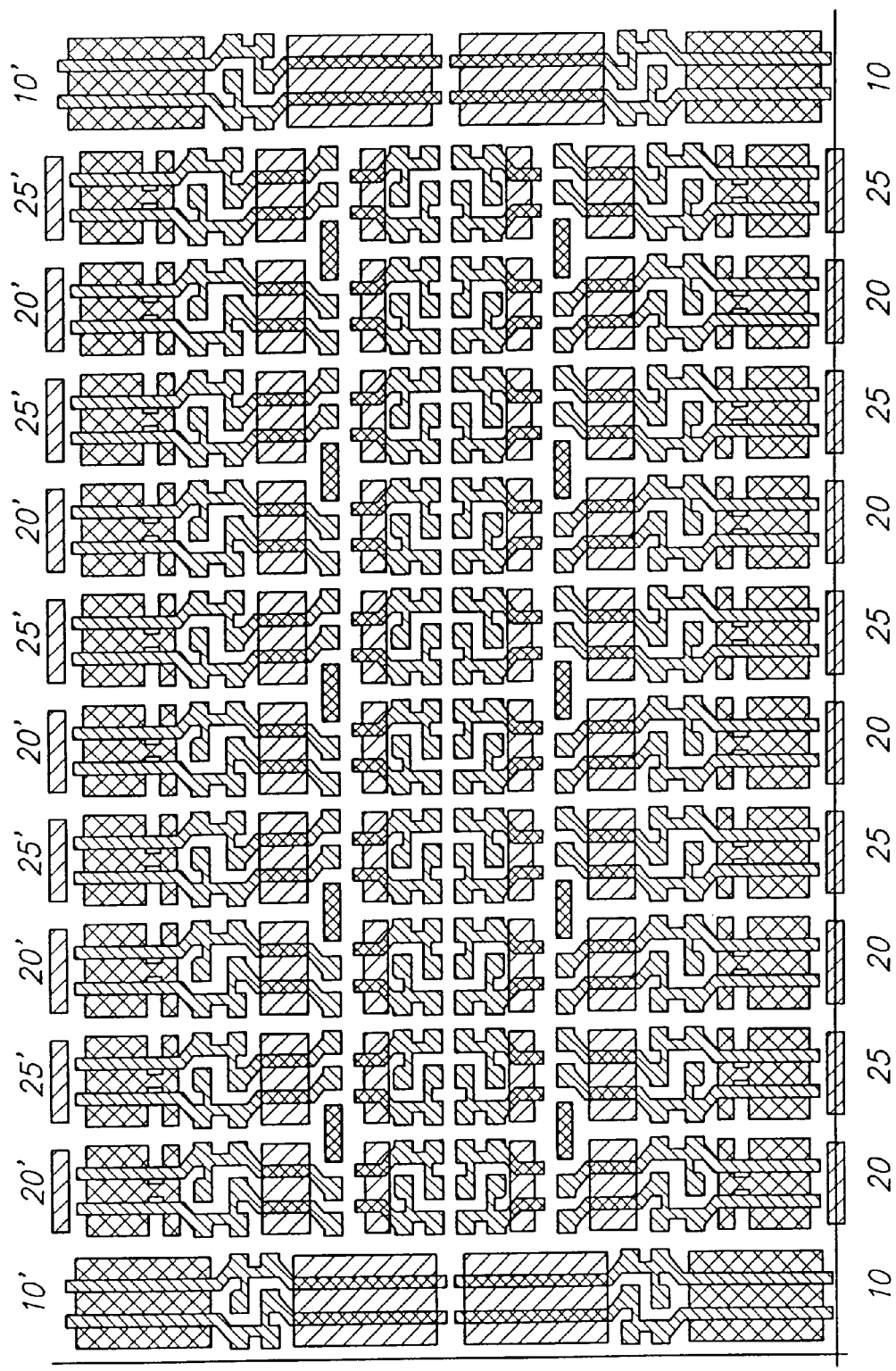
FIG. 5 shows a portion of an array constructed in accordance with the present invention, including the implementation of a 6:1 ratio between compute and drive cells within a device.
Figure 6:
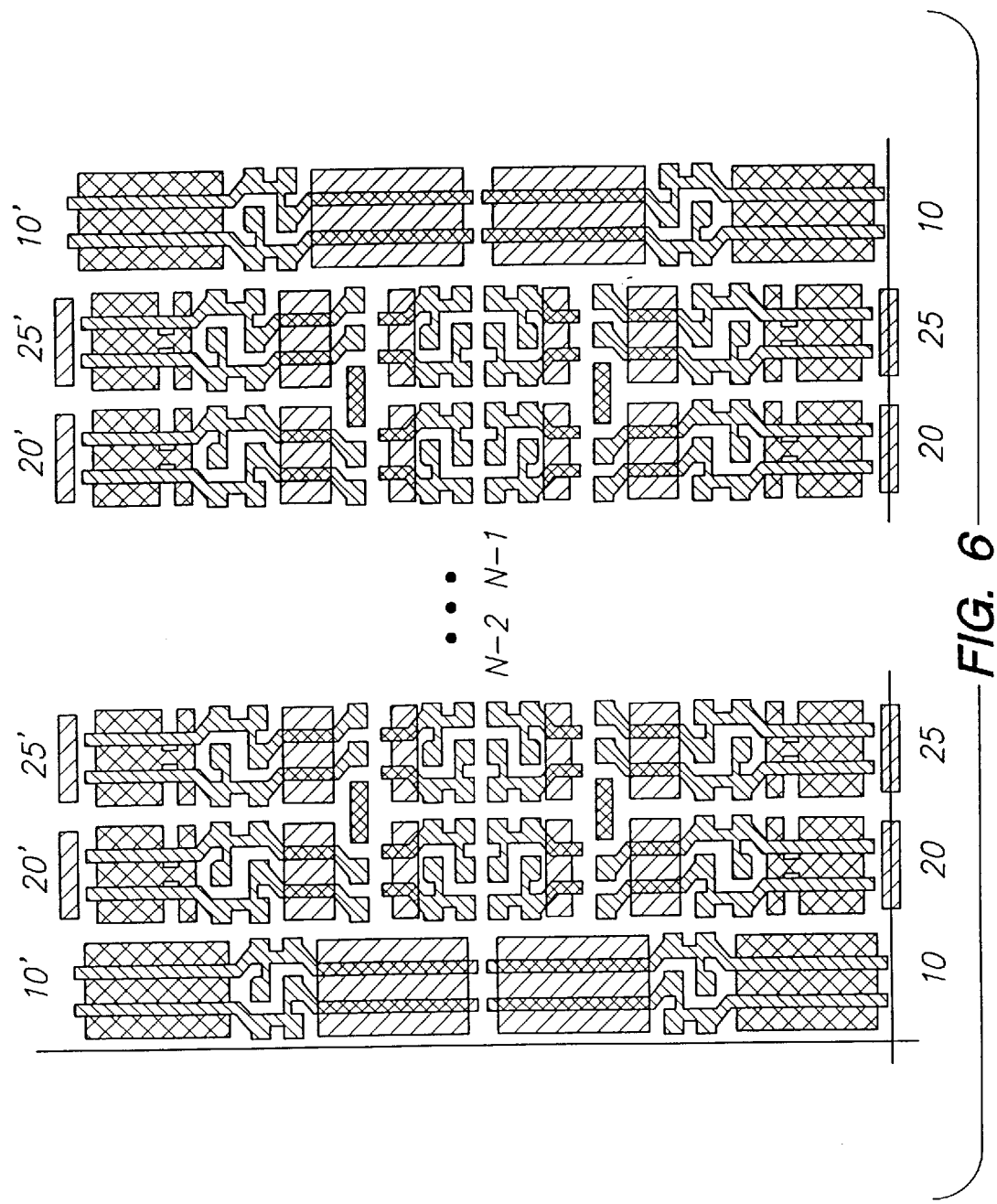
FIG. 6 shows a generalized version of FIG. 5, for an N:1 ratio.

In a significant departure from the prior art, the cell structure of the present invention permits virtually any ratio of compute cells to drive cells, instead of the 3:1 ratio typically found in the prior art. Thus, as shown in FIG. 5, the cell structure of the present invention permits compute/drive ratios of 5:1 or higher. For convenience, elements in FIG. 5 have been assigned their analogous reference numerals from FIG. 4. The ratio of compute to drive cells with the present invention may be expressed generally as N:1, where N is any desired integer, as shown generally in FIG. 6. In addition, if desired, an array of only compute cells could be configured, or a ratio of N:0; or, in at least some embodiments, an odd number of cells could be disposed between the drive cells.

From the foregoing, it can be appreciated that a new and novel technique for providing high density, low power standard cell structures has ben disclosed. The technique also has the advantage, in at least some embodiments, of permitting better routability and yield. Having fully described one embodiment of the present invention, it will be apparent to those of ordinary skill in the art that numerous alternatives and equivalents exist which do not depart from the invention set forth above. It is therefore to be understood that the invention is not to be limited by the foregoing description, but only by the appended claims.

What is claimed is:

1. In a mask programmable array, a basic cell comprising a drive cell, and a plurality of compute cells wherein the ratio of compute cells to drive cells is N:1 and N is greater than four and wherein each of the compute cells includes a substrate tap.

2. In a mask programmable array, a basic cell comprising a drive cell comprising at least one N-type diffusion and at least one P-type diffusion and including at least one gate for each diffusion, and a compute cell comprising at least one P-type diffusion and at least two N-type diffusions, and including at least one gate for each diffusion, the compute cell further including a substrate tap located between the two N-type diffusions.

3. The basic cell of claim 2 wherein the substrate tap is located to permit substrate taps of adjacent cells to abut one another.

4. The basic cell of claim 2 wherein the compute cell is adapted to be located adjacent to at least one other compute cell and further including, in the compute cell, a well tap separated from a well tap in an adjoining compute cell.

5. In a mask programmable array, a basic cell comprising a drive cell comprising at least one N-type diffusion and at least one P-type diffusion and including at least one gate for each diffusion, the N-type and P-type diffusions of adjacent drive cells being separated from one another and adapted to permit a routing track to extend therebetween, and a compute cell comprising at least one P-type diffusion and at least two N-type diffusions, and including at least one gate for each diffusion, the compute cell further including a substrate tap located between the two N-type diffusions.

* * * * *